US006966363B2

(12) United States Patent  
Gailus et al.

(10) Patent No.: US 6,966,363 B2
(45) Date of Patent: Nov. 22, 2005

(54) HEAT COLLECTOR WITH MOUNTING PLATE

(75) Inventors: David W Gailus, Merrimack, NH (US); Donald L. Clemens, The Colony, TX (US)

(73) Assignee: Aavid Thermolloy, LLC, Concord, NH (US)

( * ) Notice: Subject to any disclaimer, the term of this patent is extended or adjusted under 35 U.S.C. 154(b) by 0 days.

(21) Appl. No.: 10/492,068

(22) PCT Filed: Oct. 10, 2002

(86) PCT No.: PCT/US02/32447

§ 371 (c)(1),
(2), (4) Date: Apr. 8, 2004

(87) PCT Pub. No.: WO03/031897

PCT Pub. Date: Apr. 17, 2003

(65) Prior Publication Data

US 2004/0188080 A1    Sep. 30, 2004

Related U.S. Application Data

(60) Provisional application No. 60/328,330, filed on Oct. 10, 2001.

(51) Int. Cl.⁷ ................................................ F28F 7/00
(52) U.S. Cl. ................ 165/185; 165/104.33; 165/80.4; 361/697; 361/700; 257/715; 174/16.3
(58) Field of Search ........................... 165/185, 104.21, 165/104.33, 80.4; 361/699, 700, 697; 257/714–716; 174/15.2

(56) References Cited

U.S. PATENT DOCUMENTS

| 4,538,170 | A | * | 8/1985 | Yerman | 257/705 |
|---|---|---|---|---|---|
| 5,176,524 | A | * | 1/1993 | Mizuno et al. | 439/68 |
| 5,276,585 | A | * | 1/1994 | Smithers | 361/704 |
| 5,278,447 | A | * | 1/1994 | Vongfuangfoo et al. | 257/727 |
| 5,339,214 | A | | 8/1994 | Nelson | |
| 5,392,193 | A | * | 2/1995 | Robertson et al. | 361/704 |
| 5,426,405 | A | * | 6/1995 | Miller et al. | 333/247 |
| 5,549,155 | A | | 8/1996 | Meyer, IV et al. | |
| 5,725,050 | A | | 3/1998 | Meyer, IV et al. | |
| 5,886,870 | A | * | 3/1999 | Omori | 361/704 |
| 6,102,110 | A | * | 8/2000 | Julien et al. | 165/104.33 |
| 6,128,190 | A | * | 10/2000 | Hardin et al. | 361/704 |
| 6,152,213 | A | * | 11/2000 | Suzuki | 165/104.33 |
| 6,205,026 | B1 | * | 3/2001 | Wong et al. | 361/704 |
| 6,263,956 | B1 | * | 7/2001 | Tang et al. | 165/80.3 |
| 6,347,036 | B1 | * | 2/2002 | Yeager et al. | 361/687 |
| 6,352,103 | B1 | | 3/2002 | Chu et al. | |
| 6,359,780 | B1 | | 3/2002 | McMahan et al. | |
| 6,400,565 | B1 | | 6/2002 | Shabbir et al. | |
| 6,449,157 | B1 | * | 9/2002 | Chu | 361/704 |
| 6,625,021 | B1 | * | 9/2003 | Lofland et al. | 361/697 |

* cited by examiner

Primary Examiner—Terrell Mckinnon
(74) Attorney, Agent, or Firm—Cohen, Pontani, Lieberman & Pavane

(57) ABSTRACT

A heat collector (50) is formed by at least one extruding step for reducing machining steps, and is assembled to a separately formed mounting frame (40) which may be stamped and formed or molded. The heat collector has flanges (53) which bear against retaining tabs (45) formed on the mounting frame, and may be held by solder, glue, or mechanical means. The heat collector may receive a heat dissipator (18), or may be formed as a heat sink (56) such as a pin-fin type heat sink. The mounting frame can be fixed to a printed circuit board or the like having a component such as a central processing unit which contacts the collector in order to cool the unit.

16 Claims, 6 Drawing Sheets

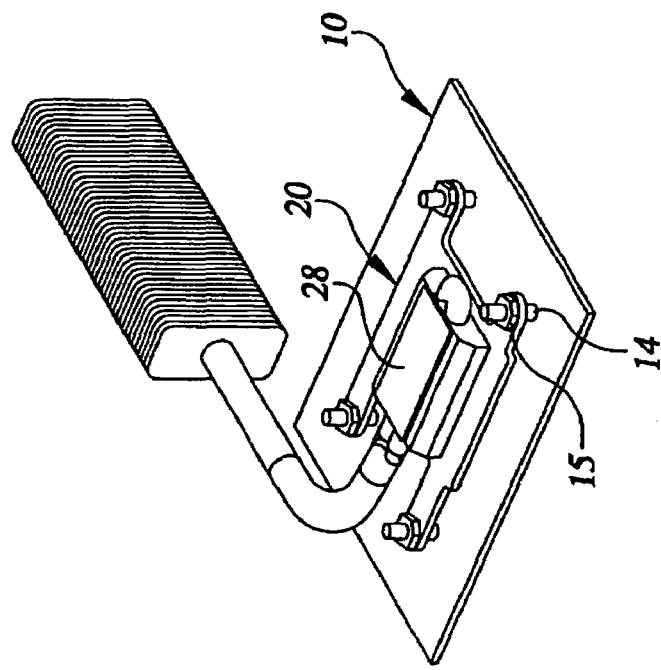
FIG.1B *PRIOR ART*
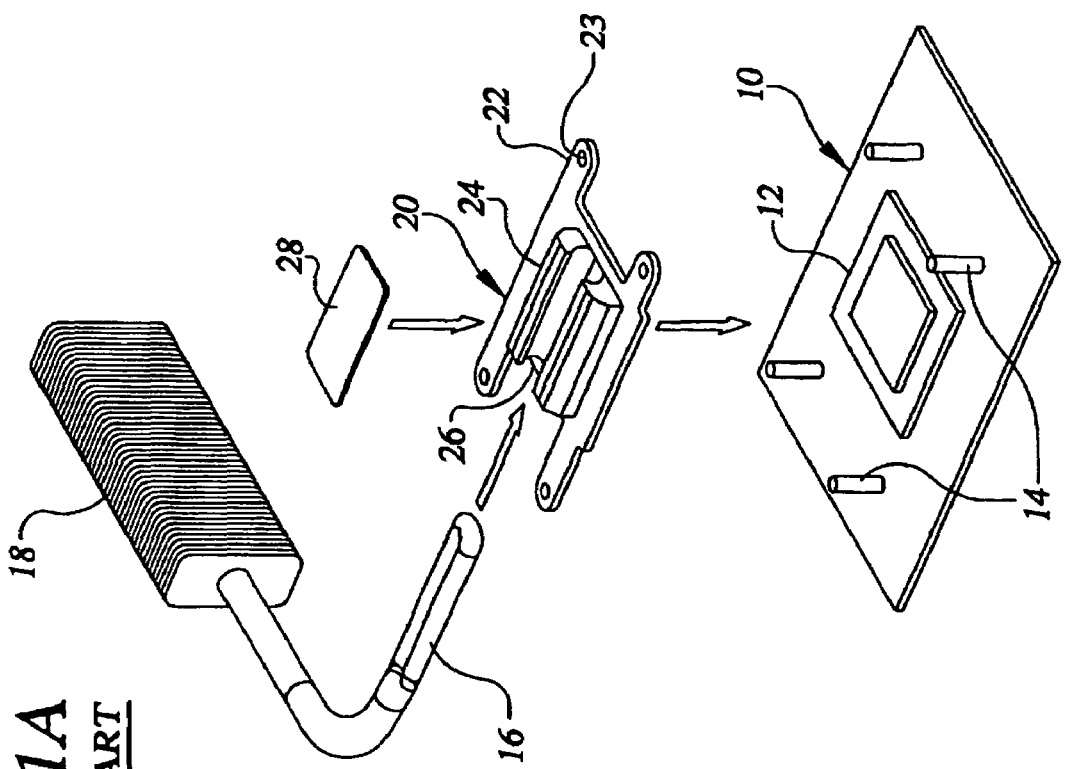
FIG.1A *PRIOR ART*

HEAT COLLECTOR WITH MOUNTING PLATE

This is a U.S. national stage of application No. PCT/US02/32447, filed on Oct. 10, 2002. Priority is claimed on the following application: Country: U.S. of America, Application No. 60/328,330, Filed: Oct. 10, 2001.

BACKGROUND OF THE INVENTION

1. Field of the Invention

The present invention relates to a heat sink for cooling an electronic device mounted to a printed circuit board, and in particular to a surface mounted collector plate which is in direct thermal contact with a CPU.

2. Description of the Related Art

The current collector plate incorporates features for mounting to a printed circuit board, thermal contact with a CPU and heat spreading, and connection to a heat pipe all in a single part. This requires multiple machining steps and plating on a monolithic part.

Referring to FIGS. 1A and 1B, a CPU 12 is mounted to a PCB 10 which is provided with studs 14 for mounting a heat collector 20 including a mounting plate 25 having tabs 22 and holes 23 for receiving the studs 14. The collector 20 is also provided with parallel ridges 24 defining a central channel 26 which receives a heat pipe 16 connected to a heat dissipator 18 having cooling fins. It is partially filled with liquid which undergoes a cycle of condensation and evaporation between the collector 20 and the heat dissipator 18. The pipe may be received in the channel in a press-fit, or it may be soldered or held by thermally conductive bonding, whereupon a cover plate 28 is soldered or bonded in place to improve heat transfer. The pipe 16 is shown having a closed end, buy may also be part of a conventional cooling loop.

FIGS. 2A to 2C show the steps which are necessary to produce the unitary heat collector 20 and mounting plate 20 according to the prior art. FIG. 2A shows a machined or extruded block of metal 21 having a pair of ridges 24 upstanding from a plate 25 and flanking a central channel 26, and an inset 27 for receiving a cover plate. Whether the block is machined or extruded depends on the material; copper is not as readily extruded as aluminum. The material chosen depends on the desired properties such as cost, weight, thermal conductivity, extrudability, and solderability. The block of FIG. 2A is milled to enlarge the base plate 25 at both ends of the ridges 24 (FIG. 2B). The plate 25 is then milled to form the tabs 22 and drilled to form the holes 23 (FIG. 2C).

FIG. 3A shows the first step in producing a unitary pin fin type heat sink according to the prior art, wherein a plate 32 having upstanding ribs 33 is extruded. FIG. 3B shows the second step, wherein the ribs are machined or gang-sawed to produce pins 34. As shown in FIG. 3C, the plate is then machined to produce tabs 36, and the tabs are drilled to produce holes 38.

SUMMARY OF THE INVENTION

According to the invention, the attachment/alignment features are separated from the thermal features, thereby reducing production costs by eliminating multiple machining steps. The heat collector according to the invention includes two parts, a block to collect heat from a CPU or the like, and a molded or stamped frame that surrounds and locates the block and also provides mounting features such as bosses for screws, bolts, rivets, push-pins or the like.

The invention is based on the realization that the heat collecting and dissipating function is independent of the mounting and locating function, whereby the functions may be assumed by separate parts which are collectively less expensive to manufacture than a single part, which typically requires numerous machining steps. The invention also permits using any number of heat collector configurations with the same mounting plate.

The metal heat collector may be an extrusion, plated (if required) as one part and cut to length. This is preferable for a heat-pipe type heat collector or a fin type heat sink. Pin fin type heat sinks as depicted in the figures require some machining after extrusion. Note that the term "heat collector" as used herein refers to an element which "collects" the heat from a source such as a chip, and either dissipates the heat or transfers it by a pipe or the like to a remote heat dissipator. The term "heat sink" as used herein refers to an element which not only collects the heat, but performs the dissipating function. Thus a heat sink is a species of collector.

The mounting frame may be molded of plastic, thereby eliminating all machining and drilling. Plastic may be molded of metal filled material for EMI shielding. The plastic may be highly heat resistant so that the heat pipe can be soldered to the heat sink after assembly.

The mounting frame may also be stamped and formed of metal, which would not only eliminate machining and drilling, but would also aid in heat dissipation. Similar parts could be made of spring steels and incorporate springs for heat sink attachment to PCB's. Where both parts are metal, several methods including soldering, swaging, staking, brazing, bonding, welding and spot welding can be used to join the parts.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

FIG. 1A is an exploded perspective of a prior art heat pipe type heat collector assembly and a printed circuit board;

FIG. 1B is a perspective of the prior art heat collector assembly as assembled to a printed circuit board;

DETAILED DESCRIPTION OF THE PRESENTLY PREFERRED EMBODIMENTS

Figure 2A:
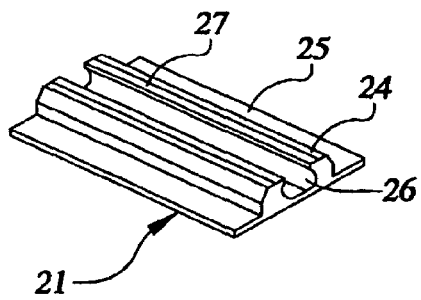
FIGS. 2A–2C show manufacturing steps of a prior art heat collector for a heat pipe.
Figure 2B:
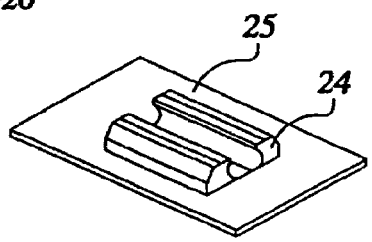
Figure 2C:
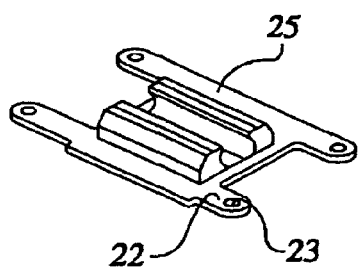
Figure 3A:
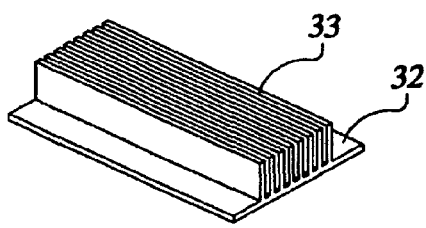
FIGS. 3A–3C show manufacturing steps of a prior art pin fin type heat sink with mounting tabs.
Figure 3B:
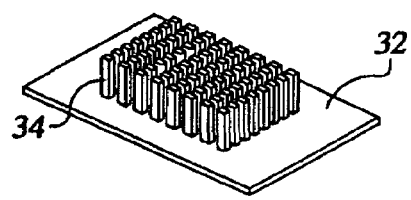
Figure 3C:
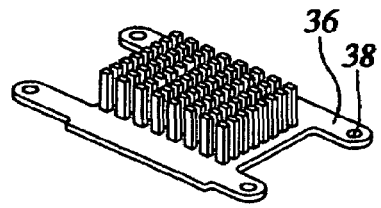
Figure 4A:
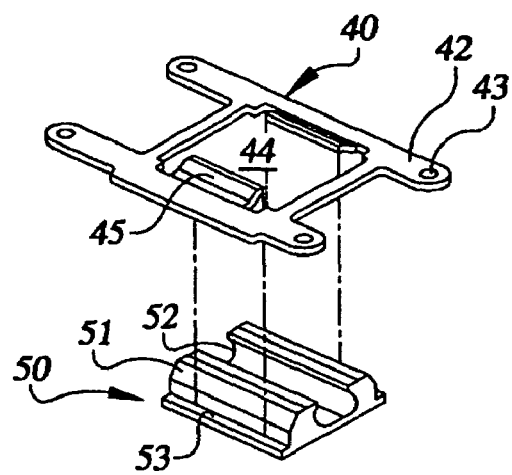
FIG. 4A is an exploded perspective of a two-part heat collector according to the invention.
Figure 4B:
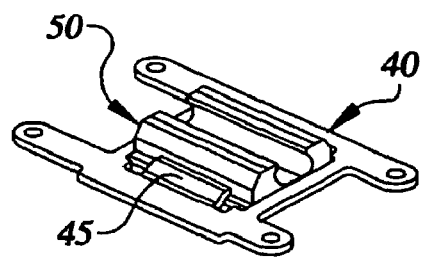
FIG. 4B is a perspective of an assembled two-part heat collector according to the invention.

Referring to FIGS. 4A and 4B, the mounting frame 40 is stamped and formed of metal plate such as aluminum and includes mounting tabs 42 having holes 43, a central aperture 44, and retaining tabs 45 formed to extend above a plane containing the mounting tabs 42. The heat collector 50 is profiled for close reception in the central aperture 44 of the mounting frame 40, and has side flanges 53 which bear against retaining tabs 45. Parallel ridges 51 define a channel 52 which receives the heat pipe, the collector 50 preferably being extruded copper in order to facilitate soldering to a copper heat pipe. Note that soldering of the retaining plate 40 to the collector 50 is not necessary, but is possible where both parts are solder-compatible, thereby further improving heat dissipation.

Figure 5:
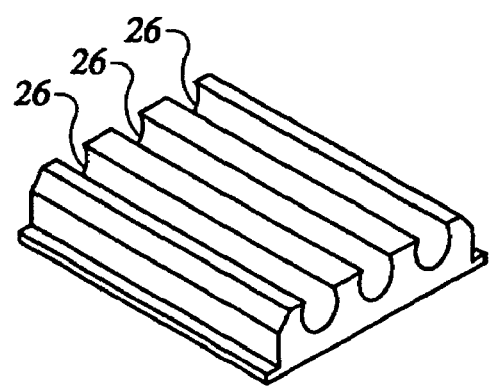
FIG. 5 is a perspective of a heat collector having multiple channels for receiving heat pipes.
Figure 6:
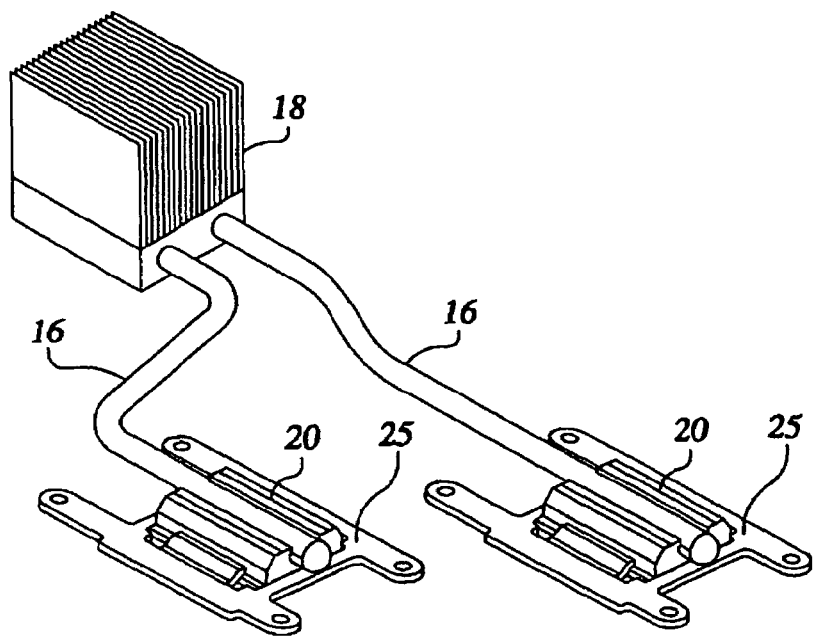
FIG. 6 is a perspective of a system having a single heat collector connected to multiple heat dissipators.

FIG. 5 shows a heat collector having multiple channels 26 for connecting multiple heat pipes to multiple dissipators in applications which require a high heat transfer. Conversely, discrete heat collectors having single channels may be connected to a single heat dissipator 18 by discrete heat pipes 16, as shown in FIG. 6.

Figure 7A:
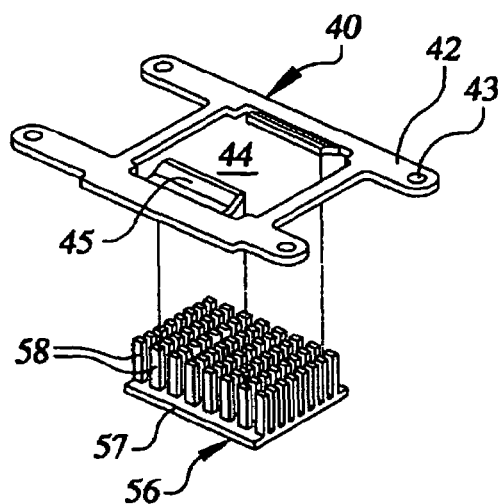
FIG. 7A is an exploded perspective of a first embodiment of a two part pin fin type heat sink according to the invention.
Figure 7B:
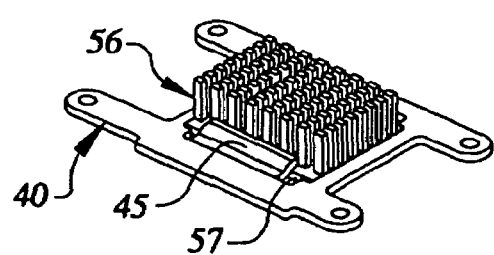
FIG. 7B is a perspective of an assembled two-part pin fin type heat sink of FIG. 6A.

FIGS. 7A and 7B show a mounting plate 40 which is substantially identical to the mounting plate in FIGS. 4A and 4B, and may likewise be either molded plastic or stamped and formed metal. Here a pin fin type heat sink 56 is provided with flanges 57 for retention by the retaining tabs 42 of the mounting plate. The heat sink 56 may be manufactured by extruding to form parallel fins, then gang sawing transversely to the fins to form fins 50, as described in U.S. Pat. No. 4,884,331.

Figure 8A:
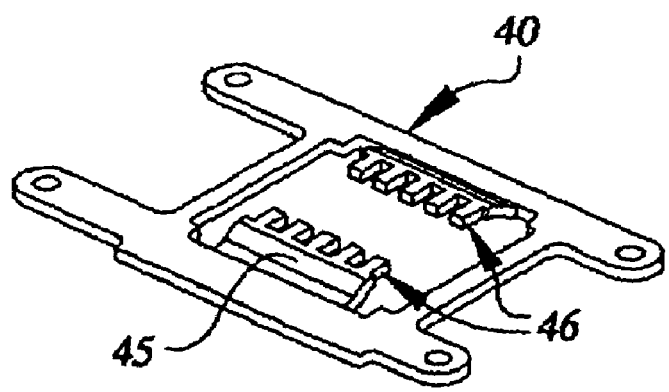
FIG. 8A is an exploded perspective of a second embodiment of a two part pin fin type heat sink according to the invention.
Figure 8B:
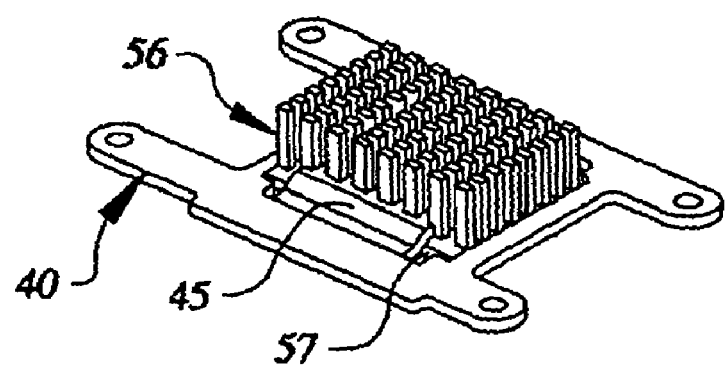
FIG. 8B is a perspective of an assembled two-part pin fin type heat sink of FIG. 7A.

FIGS. 8A and 8B show an embodiment similar to that of FIGS. 7A and 7B, wherein the retaining tabs 45 are provided with comb-like spring teeth 46 which fit between columns of pins 58. Where both parts are made of metal, this arrangement can improve thermal contact without solder, whereby one or both of the parts may be aluminum.

Figure 9:
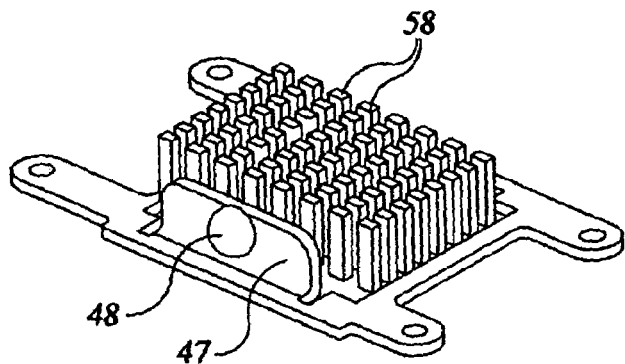
FIG. 9 is a perspective of a third embodiment of a two-part pin fin type heat sink, as assembled.

FIG. 9 shows an embodiment wherein the mounting plate 40 is formed with upwardly extending retaining tabs 47 which are attached to the heat collector by rivets 48 fitted through holes (not visible) and wedged between pins 58.

Figure 10:
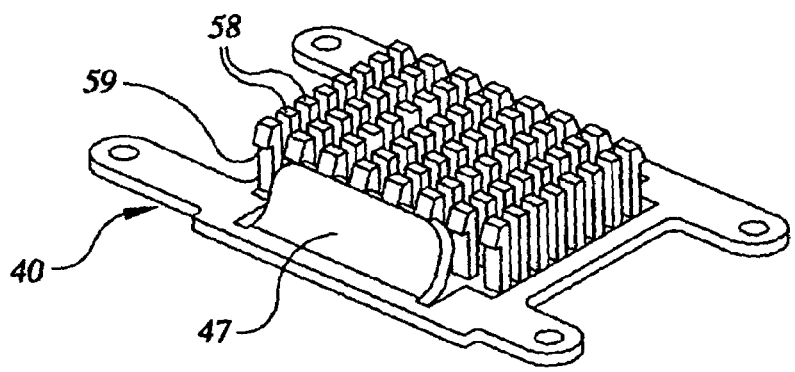
FIG. 10 is a perspective of a fourth embodiment of a two-part pin fin type heat sink, as assembled.

FIG. 10 shows an embodiment wherein upwardly extending tabs 48 engage against detents 59 formed on outside rows of pins 58, thereby retaining the heat sink 50 to the mounting plate 40 in a snap-fit.

Figure 11:
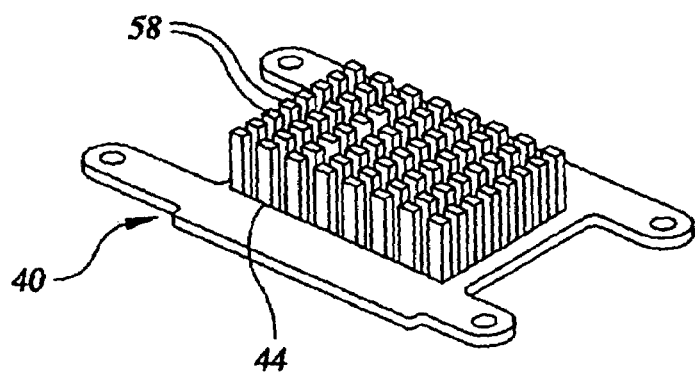
FIG. 11 is a perspective of a fifth embodiment of a two-part pin fin type heat sink, as assembled.

FIG. 11 shows a pin fin type heat sink 56 having flanges 57 (FIG. 6A) which are held against the underside of a stamped retaining plate 40 which does not have formed tabs. Here the bottom of the heat sink is not flush with the bottom of the mounting plate 40, whereby the mounting plate 40 will be spaced from the PCB when mounted.

Note that other described embodiments having retaining tabs 45 may be designed so the bottom of the heat sink is recessed in the mounting plate, whereby the mounting plate may be mounted flushly against the PCB while a CPU upstanding from the PCB is flush against the bottom of the heat sink.

Thus, while there have shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. A heat collector assembly comprising:
   a heat collector which can be fitted against a component to be cooled, said heat collector having two opposed lateral flanges, and
   a mounting frame formed separately from said heat collector and fitted thereto, said mounting frame having a central aperture having a fixed dimension which receives said heat collector, and retaining means integral with and fixed to the mounting frame which bear against said flanges to position said heat collector with respect to said mounting frame and to urge the heat collector against the component.

2. A heat collector as in claim 1 wherein said mounting frame is a substantially planar plate.

3. A heat collector as in claim 2 wherein said retaining means comprise retaining tabs extending above the plane of the plate.

4. A heat collector as in claim 1 wherein said mounting frame is stamped and formed of metal.

5. A heat collector as in claim 1 wherein said mounting frame is molded of plastic.

6. A heat collector as in claim 1 wherein said heat collector is formed with a channel for receiving a heat pipe.

7. A heat collector as in claim 6 wherein said heat collector is formed with a pair of parallel ridges flanking said channel, said flanges flanking said ridges.

8. A heat collector as in claim 6 wherein said heat collector is formed with a plurality of said channels in parallel for receiving a respective plurality of heat pipes.

9. A heat collector as in claim 6 wherein said heat collector is an extruded piece.

10. A heat collector as in claim 1 wherein said mounting frame is stamped and formed of metal.

11. A heat collector as in claim 1 wherein said mounting frame is molded of plastic.

12. A heat collector as in claim 1 wherein said heat collector is a pin fin type heat sink having rows of pins parallel to said flanges.

13. A heat collector as in claim 12 wherein said retaining means comprise retaining tabs having comb-like teeth which extend between pins in rows adjacent to said flanges.

14. A heat collector as in claim 12 wherein said retaining means comprise tabs which are formed upward and bear against respective rows of pins which are adjacent to said flanges.

15. A heat collector as in claim 14 wherein said pins in rows next to said flanges have distal ends formed with detents which lock against distal ends of said upward formed tabs.

16. A heat collector as in claim 14 wherein said upward formed tabs have respective holes, said heat collector further comprising rivets extending through said holes and between respective pairs of pins.

\* \* \* \* \*